(12) United States Patent
Goldfarb et al.

(10) Patent No.: US 6,194,958 B1
(45) Date of Patent: Feb. 27, 2001

(54) FILTER HAVING MINIMIZED CUT-OFF FREQUENCY VARIATIONS

(75) Inventors: Marc E. Goldfarb, Atkinson, NH (US); Wyn T. Palmer, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/410,155

(22) Filed: Sep. 30, 1999

(51) Int. Cl.[7] .................................. H03B 1/00; H03K 5/00
(52) U.S. Cl. ............................................. 327/552; 327/558
(58) Field of Search ..................................... 327/551, 552, 327/553, 554, 558; 341/143

(56) References Cited

U.S. PATENT DOCUMENTS

| | | | |
|---|---|---|---|
| 5,296,822 | * 3/1994 | Cockey, IV | 330/306 |
| 5,570,049 | * 10/1996 | Chen | 327/552 |
| 5,572,163 | * 11/1996 | Kimura et al. | 327/553 |
| 5,610,551 | * 3/1997 | Hosoya | 327/552 |

* cited by examiner

Primary Examiner—My-Trang Nu Ton
(74) Attorney, Agent, or Firm—Fish & Richardson P.C.

(57) ABSTRACT

A filter having a semiconductor chip and a low pass filter section on the chip. The low pass filter section includes a filter transconductor and a filter capacitor connected to the filter capacitor. The low pass filter section has a cut-off frequency related to the transconductance, $gm_F$, of the filter transconductor and the capacitance of the filter capacitor. A gm control circuit having a control circuit transconductor is provided. The gm control circuit includes a first oscillator for producing a reference frequency. The first oscillator has a portion thereof on the chip and an off-chip capacitor and off-chip resistor. The reference frequency is a function of the capacitance of the off-chip capacitor and the resistance of the off-chip resistor. A second oscillator is on the chip and produces a variable frequency. The second oscillator has an on-chip capacitor. The variable frequency is a function of the capacitance of the on-chip capacitor and on-chip transconductor, $gm_C$, such variable frequency is controlled by a control circuit transconductor control signal. A control loop is provided. The control loop is responsive to a difference between the reference frequency and the variable frequency and such loop produces the a feedback signal to drive the variable frequency towards the reference frequency.

7 Claims, 2 Drawing Sheets

FILTER HAVING MINIMIZED CUT-OFF FREQUENCY VARIATIONS

BACKGROUND OF THE INVENTION

This invention relates generally to filters and more particularly to methods and apparatus for tuning the bandwidth, or cut-off frequency, of such filters. Still more particularly, the invention relates to a method for minimizing cut-off frequency variation of such filters by using external reference components.

As is known in the art, an integrated circuit low pass filter using commonly available active and passive components will experience a large variation in the actual cut-off frequency due to the component dependencies on fabrication processes and temperature and can be controlled to a small variation (i.e., tolerance) in its value. Additionally, all stages in a multi-stage filter will vary independently. Such variations are undesirable in many applications.

SUMMARY OF THE INVENTION

In accordance with the present invention, a filter is provided having a low pass filter section on a semiconductor integrated circuit chip. The low pass filter section includes an on-chip component. The low pass filter section has a cut-off frequency related to the on-chip component. A control circuit is provided. The control circuit includes an on-chip component and an off-chip component. The control circuit on-chip component and the filter on-chip component are subject to the same integrated circuit fabrication process, and/or temperature, and are therefore matched. The control circuit off-chip component, being off-chip, is independent of the chip fabrication process, and/or temperature. The control circuit off-chip component is established in accordance with a desired low pass filter section cut-off frequency. In order to compensate for process, and/or temperature, induced variations in the desired cut-off frequency of the low pass filter section, a control loop is provided. The control loop is responsive to a control signal which is a proportional to the difference between the control circuit off-chip component and the control circuit on-chip component. The control loop is responsive to this difference and automatically adjusts the on-chip component in a proportional relationship with the off-chip component. The control loop is also used to adjust the filter on-chip component thereby automatically providing the desired cutoff frequency for the low pass filter section independent of process, and/or temperature, induced variations.

In accordance with the another feature of the invention, a filter is provided having a semiconductor integrated circuit chip and a low pass filter section on the chip. The low pass filter section includes a filter transconductor and a filter capacitor connected to the filter transconductor. The low pass filter section has a cut-off frequency related to the transconductance, $gm_F$, of the filter transconductor and the capacitance of the filter capacitor, $C_F$. A gm control circuit is provided. The gm control circuit includes a control circuit transconductor, a gm control circuit on-chip capacitor $C_{INT}$, an off-chip resistor $R_{EXT}$ and an off-chip capacitor $C_{EXT}$. The control circuit transconductor and the filter transconductor are subject to the same integrated circuit fabrication process and are therefore matched. The resistor $R_{EXT}$ and capacitor $C_{EXT}$, being off-chip, are independent of the fabrication process. The product $R_{EXT}C_{EXT}$ is established in accordance with a desired low pass filter section cut-off frequency. The on-chip capacitor, $C_{INT}$, is matched to the filter capacitor, $C_F$, and is therefore both subject to the same IC chip fabrication process. In order to compensate for process and/or temperature, induced variations in the desired cut-off frequency of the low pass filter section, the $gm_F$ of the filter transconductor is corresponding varied by a control loop to maintain $R_{EXT}C_{EXT}$ proportional to $gm_F^{-1}C_{INT}$. More particularly, the transconductance, $gm_C$, of the control circuit transconductor is automatically adjusted by a control signal produced by the control circuit so that its $gm_C^{-1}$ times $C_{INT}$ product is in proper proportion to $R_{EXT}C_{EXT}$. Simultaneously, the control signal is also used to adjust the $gm_F$ of the filter transconductor thereby automatically providing the desired cut-off frequency for the low pass filter section independent of process and/or temperature, induced variations.

In accordance another aspect of the invention, a filter is provided having a semiconductor integrated circuit chip and a low pass filter section on the chip. The low pass filter section includes a filter transconductor and a filter capacitor connected to the filter transconductor. The low pass filter section has a cut-off frequency related to the transconductance, $gm_F$, of the filter transconductor and the capacitance of the filter capacitor. A gm control circuit having a control circuit transconductor is provided. The gm control circuit includes a first oscillator for producing a reference frequency. The first oscillator has a portion thereof on-chip, an off-chip capacitor, and an off-chip resistor. The reference frequency is inversely proportional to the product of the capacitance of the off-chip capacitor and the resistance of the off-chip resistor. A second oscillator is on the chip and produces a variable frequency. The second oscillator has an on-chip capacitor. The variable frequency is proportional to the transconductance $gm_C$ of the control circuit transconductor divided by the capacitance of the on-chip capacitor. The variable frequency is controlled by a feedback control signal. A control loop is provided. The control loop is responsive to a difference between the reference frequency and the variable frequency and such loop produces the control circuit transconductor control signal which feeds the control loop. The control loop, in response to the transconductor control signal, produces the feedback signal to drive the variable frequency towards the reference frequency. The control circuit includes the control circuit transconductor. The control circuit transconductor control signal varies the transconductance of the control circuit transconductor in accordance with the control circuit transconductor control signal, correspondingly changing the transconductance of the filter transconductor, and correspondingly changing the cut-off frequency of the low pass filter section.

With such an arrangement, by using a phase locked loop in the control loop and a pair of on-chip oscillators, the cut-off frequency of the low pass filter section can be controlled and variations thereof minimized using off-chip components to control the reference frequency.

In accordance with another aspect of the invention, the filter includes a plurality of serially coupled filter sections, the transconductance of the filter transconductor thereof being varied in accordance with the control circuit transconductor control signal produced by the gm control circuit.

With such an arrangement, the cut-off frequency can be controlled so that all of the serially coupled low pass filters (i.e., stages) have a fixed frequency relationship to one another.

In accordance with one embodiment of the invention, the gm control circuit includes a frequency/phase comparator, fed by the reference frequency and the variable frequency, for producing an output signal related to the difference between such fed signals. A variable current source is provided that is controlled by the output signal. An output of the current source provides the control circuit transconductor control signal for the control circuit transconductor.

In accordance with another aspect of the invention, a common mode reference voltage is fed to the control circuit transconductor. A common mode voltage control circuit is fed by the common mode reference voltage and an output of the control circuit transconductor for providing a common mode control signal related to the common mode reference voltage. A second current source is controlled by the common mode control signal for supplying current to the control circuit transconductor in accordance with the common mode control signal. A control voltage feedback loop, responsive to the current supplied by the second current source to the control circuit transconductor, produces the feedback signal.

BRIEF DESCRIPTION OF THE DRAWING

These and other features of the invention will become more readily apparent from the following detailed description when taken together with the accompanying drawings, in which.

DESCRIPTION OF THE PREFERRED EMBODIMENTS

Figure 1:
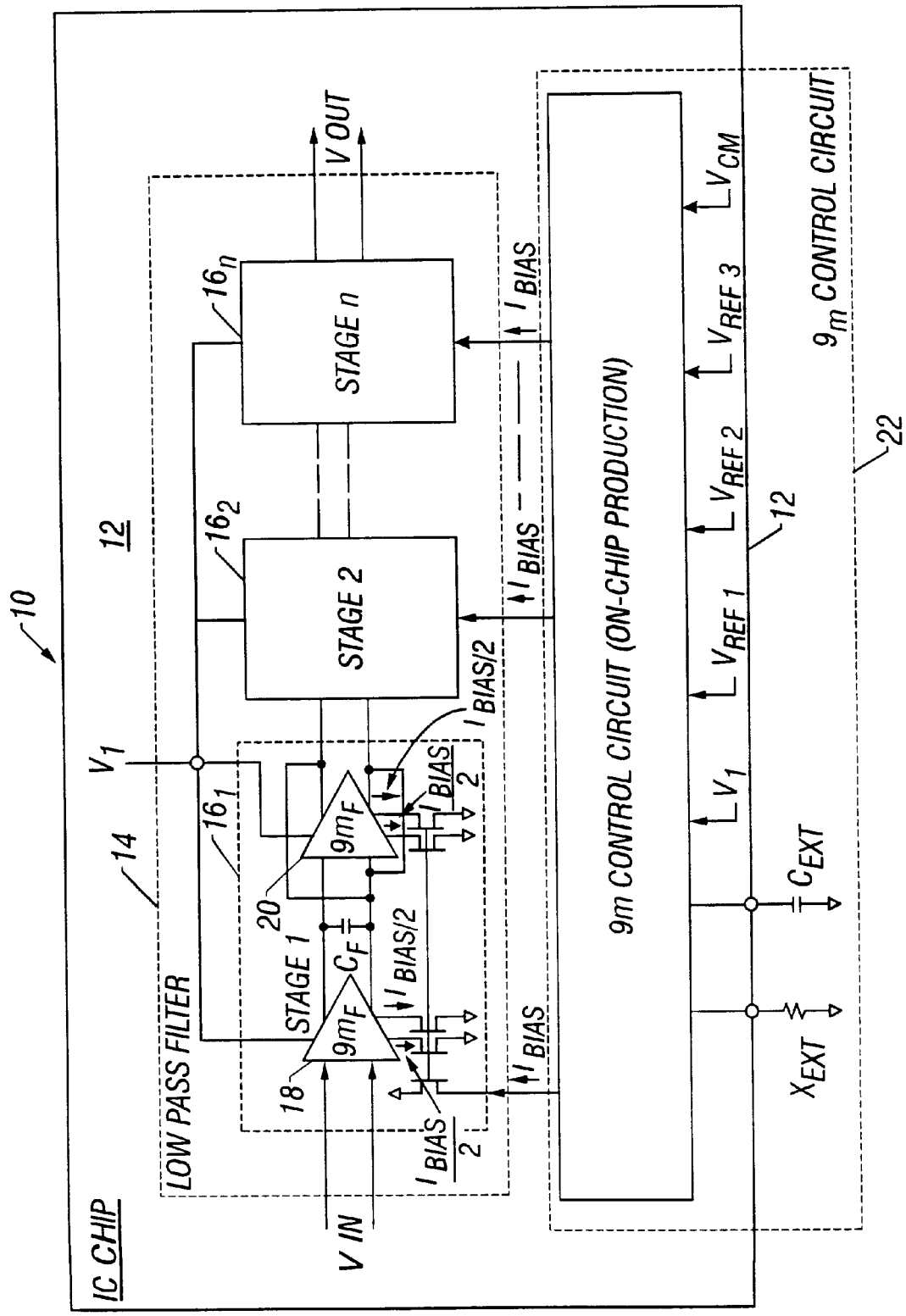
FIG. 1 is a block diagram of a filter in accordance with the invention.

Referring now to FIG. 1, a filter 10 is shown having a semiconductor chip 12. A low pass filter section 14 is on the chip 12. The low pass filter section 14 includes a plurality of, here n, serially coupled filter stages $16_1$–$16_n$. Each one of the low pass filter stages $16_1$–$16_n$ employ identical transconductors. An exemplary one thereof, here stage $16_1$ is shown in detail to include a pair of transconductors 18, 20 (hereinafter sometimes referred to as filter transconductors) and a capacitor, $C_F$, (sometimes hereinafter referred to as a filter capacitor, $C_F$) disposed therebetween and arranged in a conventional manner to provided a low pass filter having a cut-off frequency related to the transconductance, $gm_F$, of the filter is transconductors 18, 20 and the capacitance of the filter capacitor, $C_F$. More particularly, the cut-off frequency of the low pass filter section 14 is proportional to $gm_F/C_F$. It is to be noted that the stages are not identical but can be combined in various ways. For example, the capacitor values may differ from stage to stage.

A gm control circuit 22 is provided. The gm control circuit 22 is shown in more detail in FIG. 2 and has an on-chip transconductor 24 (hereinafter sometimes referred to as a control circuit transconductor) matched to the filter transconductors 18, 20. The gm control circuit 22 includes an off-chip, i.e., external, resistor $R_{EXT}$ and an off-chip capacitor $C_{EXT}$. These off-chip components are relatively precise devices and are independent of the integrated circuit chip (i.e., IC chip) fabrication process. Thus, once the desired cut-off frequency of the filter is selected, the values of $R_{EXT}$ and $C_{EXT}$ are selected in accordance with such desired cut-off frequency.

The gm control circuit 22 includes an on-chip capacitor $C_{INT}$. The on-chip capacitor $C_{INT}$ and the on-chip filter capacitors $C_F$ are on the same chip and are therefore subject to the same IC chip fabrication process (i.e., they are matched). As noted above, the low pass filter cut-off frequency is proportional to $gm_F/C_F$. In order to compensate for process variation induced variations in the desired cut-off frequency of the low pass filter section 14 (which result, inter alia, from such process variation effect on the filter capacitors $C_F$, which, as noted above, are matched by a variation in $C_{INT}$), the $gm_F$ of the filter transconductors 18, 20 is varied to counteract such process variations and provide the low pass filter section with the desired cut-off frequency. More particularly, and as will be described in more detail below in connection with FIG. 2, the transconductance, $gm_C$, of the control circuit transconductor 24 (FIG. 2) is automatically adjusted by a control signal produced by the control circuit 22 so that its $gm_C^{-1}$ times $C_{INT}$ product is in proper proportion to $R_{EXT}C_{EXT}$. The control signal is then used to adjust the $gm_F$ of the filter transconductors 18, 20 thereby automatically providing the desired cut-off frequency for the low pass filter section 14 independent of the process induced variations in the filter capacitors $C_F$ and the filter transconductors $gm_F$.

Figure 2:
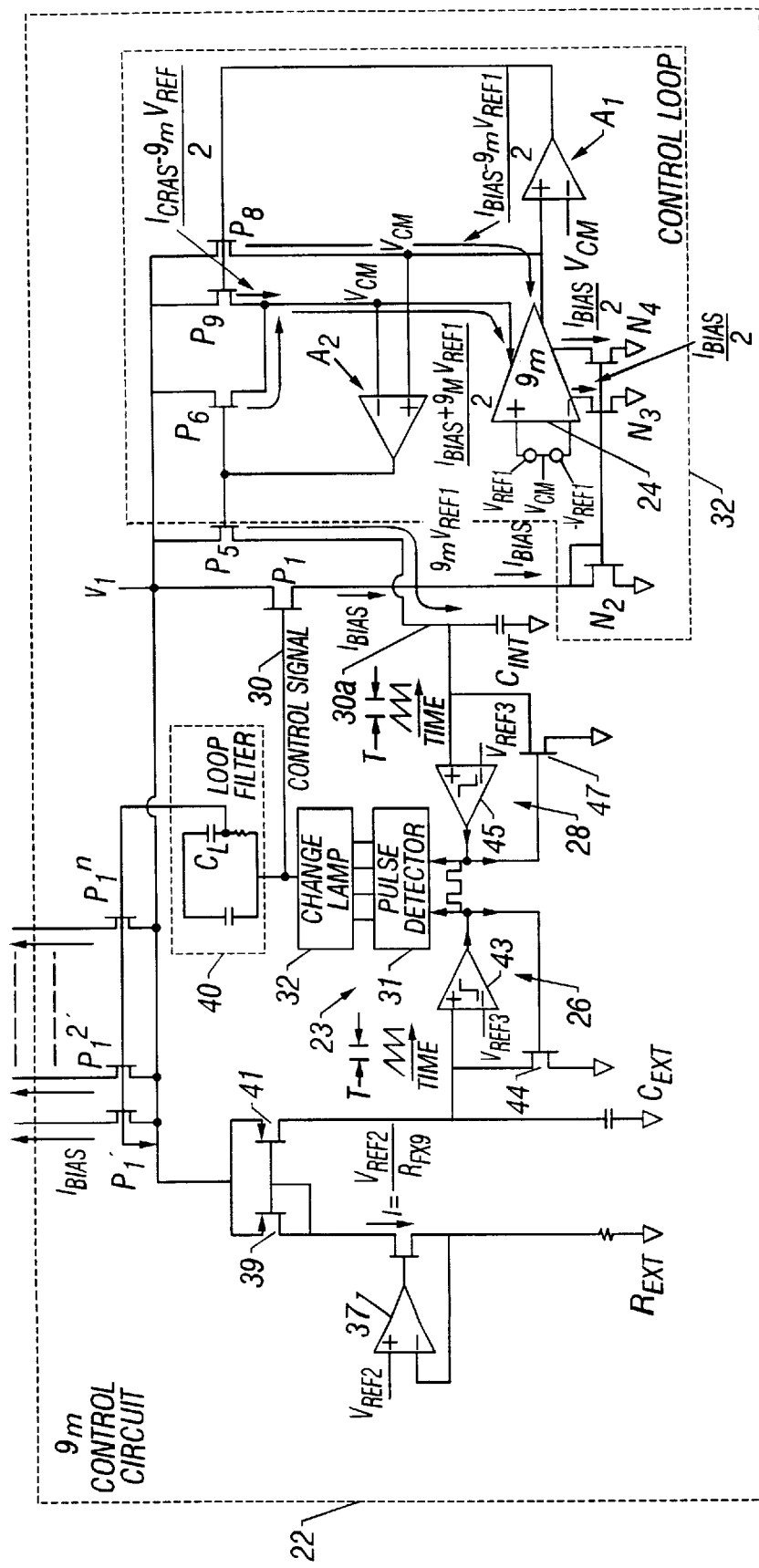
FIG. 2 is a block diagram of a gm control circuit used in the filter of FIG. 1.

More particularly, and referring to FIG. 2, the gm control circuit 22 includes a first oscillator 26 for producing a sawtooth waveform, here sawtooth voltage, with a reference frequency. The first oscillator 26 has a portion thereof on the chip 12, as shown in FIG. 1, and an off-chip capacitor, $C_{EXT}$ and off-chip resistor $R_{EXT}$. The reference frequency is inversely proportional to the product of the capacitance of the off-chip capacitor $C_{EXT}$ and the off-chip resistor $R_{EXT}$ (i.e, the reference frequency is proportional to $1/C_{EXT}R_{EXT}$).

A second oscillator 28 (FIG. 2) is on the chip 28 and produces a sawtooth waveform, here sawtooth voltage, with a variable frequency. The second oscillator 28 has an on-chip capacitor, $C_{INT}$. The variable frequency is proportional to $gm_C/C_{INT}$. The variable frequency is controlled by a feedback signal on line 30a, which is produced in a manner to be described in detail hereinafter by a control loop 32. Suffice it to say here, however, that the control loop 32 is responsive to a difference between the reference frequency and the variable frequency and such loop 32 produces the feedback signal on line 30a to drive the variable frequency towards the reference frequency.

Referring in more detail to FIG. 2 and to the gm control circuit 22, such circuit 22 includes a frequency/phase comparator section 23, here a phase locked loop (PLL) comprising a phase detector 31 and charge pump 32. The frequency/phase comparator section 23 is fed by the reference frequency and the variable frequency and produces the control circuit transconductor control signal on line 30 which is related to the difference between such fed signals. More particularly, the phase locked loop (PLL) phase detector 31 operates the charge pump 32. The charge pump 32 produces the control signal on line 30 and the voltage at a loop filter 40, as indicated.

As noted above, the control circuit 32 includes the on-chip control circuit transconductor 24. The transconductor 24 is coupled to the feedback signal on line 30a. The control circuit transconductor control signal on line 30 varies the transconductance of the control circuit transconductor 24 in accordance with the control circuit transconductor control signal on line 30 and correspondingly changes the transconductance, $gm_F$, of the filter transconductors 18, 20 (FIG. 1), and hence the cut-off frequency of the low pass filter stage $16_1$. Further, the transconductance of each of the low pass filters $16_1$–$16_n$ transconductors thereof are also varied in accordance with the control circuit transconductor control signal produced by the loop filter 40 and PMOS transistors $P^1_1$, $P^2_1$, . . . $P^n_1$ of the gm control circuit 22. Thus, the cut-off frequency can be controlled so that all low pass filters $16_1$–$16_n$ have the related cut-off frequencies.

That is, here the cut-off frequency of the composite low pass filter circuit comprising filter $16_1$–$16_n$ is maintained in fixed ratio to the frequency of the transconductance control circuit.

More particularly, and referring to FIG. 2, a reference current $I=V_{REF2}/R_{EXT}$ is established by differential amplifier 37 (which is fed $V_{VREF2}$, here a voltage proportional to a bandgap potential $V_{go}$, i.e., $V_{REF2}=k_2V_{go}$, where $k_2$ is a constant) and diode connected PMOS transistor 39 and the off-chip resistor $R_{EXT}$. The reference current is mirrored by PMOS transistor 41, and such mirrored current is fed to the off-chip capacitor $C_{EXT}$ to produce a voltage at the non-inverting input of comparator 43. The inverting input (−) of the comparator 43 is coupled to a voltage $V_{REF3}=k_3V_{go}$, where $k_3$ is a constant. The output of the comparator 43 is coupled to the phase detector 31 and back to the non-inverting input of the comparator 43 through a NMOS transistor 44 to provide the oscillator 26.

The other input to the phase detector 31 is provided by the output of a second comparator 45. This second comparator 45 has the inverting input thereof also coupled also to the reference voltage $V_{REF3}$ (here $V_{REF3}=k_3V_{go}$). The non-inverting input of comparator 45 is connected to the on-chip capacitor $C_{INT}$. It is noted that a feedback current $gm_CV_{REF1}$, from the control loop 32 (such feedback current $gm_CV_{REF1}$ being generated in a mariner to be described) is also fed to the on-chip capacitor $C_{INT}$. The output of the comparator 45 is coupled back to the non-inverting input thereof through a NMOS transistor 47 to provide the second oscillator 28.

In the steady-state, the current $I_{REF}$ will equal the feedback current $gm_CV_{REF1}$ (which is also related to the bandgap voltage by the relationship, $V_{REF1}=k_1V_{go}$) and $R_{EXT}C_{EXT}$ will be in proper proportion to $gm_C^{-1}C_{INT}$ to provide the filter section 14 with the desired cut-off frequency. More particularly, if the current from the $gm_CV_{REF}$ from the control loop 32 is too low (i.e., the comparator 45, the sawtooth frequency is too low), the voltage on line 30 across the loop filter 40 increases negatively which increases the feedback signal on line 30a (i.e, the current $gm_CV_{REF1}$) from the control loop 32 until both comparator 31 and comparator 45 produce sawtooth voltages which are locked in frequency and phase. Under such condition, $gm_C/C_{INT}$ will be driven to be equal to $[k_2/k_1]R^{-1}_{EXT}C^{-1}_{EXT}$, as desired. However, the feedback current on line 30a (i.e., $gm_CV_{REF1}$) needs to be derived from the on-chip control loop transconductor 24. Such is performed as follows: A forced, i.e., fixed, voltage $(V_{CM}+/-[V_{REF1}/2])$ is applied to the input terminals of the control circuit transconductor 24, relative to a common mode voltage, $V_{CM}$. The common mode voltage is the same common mode voltage used in the filter transconductors 18, 20. The control circuit transconductor 24 thus produces output currents $I_{BIAS}/2+/-gm_CV_{REF1}/2$. A common mode voltage control loop (made up of differential amplifier $A_1$ (which is fed the common mode voltage $V_{CM}$), and PMOS transistors $P_7$ and $P_8$ which are controlled by the voltage produced by the amplifier $A_1$) is established whereby the negative (−) output terminal of the control circuit transconductor 24 is also driven to be at the common mode voltage. Under such circumstances, the current from PMOS transistors $P_7$ and $P_8$ is defined as $[I_{BIAS}/2]-[gm_CV_{REF1}/2]$. Thus, there is a net difference between the current supplied by PMOS transistor $P_7$ (i.e., $[I_{BIAS}/2-[gm_CV_{REF1}/2])$ and that supplied by the positive output of the control circuit transconductor 24 (i.e., $[I_{BIAS}/2+[gm_CV_{REF1}/2])$ of $gm_CV_{REF1}/2$.

In order to source this feedback current $gm_CV_{REF1}$, a second control loop is added made up of differential amplifier $A_2$ and PMOS transistor $P_6$. This second control loop acts to hold the positive (+) output of the control circuit transconductor 24 at the common mode voltage, $V_{CM}$, and to source the feedback current $gm_CV_{REF1}$ using the PMOS transistor $P_6$. More particularly, the current output from PMOS transistor $P_6$ is replicated using PMOS transistor $P_5$, which supplies the feedback current $gm_CV_{REF1}$ used to ramp the voltage on the on-chip capacitor $C_{INT}$.

A variable current source is provided by PMOS transistor $P_1$ and diode-connected MOS transistor $N_2$. The current source is controlled by the control circuit transconductor control signal on line 30 and produces an output current $I_{BIAS}$, as indicated. The output current $I_{BIAS}$ of the current source provides the control circuit transconductor control signal for the control circuit transconductor 24. More particularly, variations in the voltage on line 30 produce corresponding variations in a bias current $I_{BIAS}$ through NMOS transistor $N_2$ which current is mirrored by NMOS transistors $N_3$ and $N_4$ as $I_{BIAS}/2$, as indicated. These currents $I_{BIAS}/2$ are current sinks for the control circuit transconductor 24, as indicated. A fixed voltage, $V_{CM}+/-[V_{REF1}/2]$, is fed to the input of the control circuit transconductor 24.

Finally, the output current to control the transconductance of the filter transconductors 18, 20 is provided by PMOS transistors $P_9$ and $P_{10}$. The current from these transistors $P_9$ and $P_{10}$ is equal to the average current from transistor $P_1$ (i.e., $I_{BIAS}$) used to control the transconductance of the control loop transconductor 24, as described above, because these transistors $P_9$ and $P_{10}$ are biased off the non-supply terminal of capacitor $C_L$ used in the control circuit loop filter 40. Such an arrangement reduces noise and ripple on the control currents fed to the filter transconductors 18, 20.

Thus, in summary it is noted that the reference $gm_C$ (i.e., the $gm_C$ of the control circuit transconductor 24 (and the $gm_F$ of the filter transconductors 20, 22) operate under identical bias conditions (i.e., output and input terminals are at the same common mode voltage, $V_{CM}$) and the bias currents used for the transconductors 24, 20 and 22 are identical leading to excellent matching.

Other embodiments are within the spirit and scope of the appended claims.

What is claimed is:

1. A filter, comprising:
   a semiconductor integrated circuit chip;
   a low pass filter section on the chip, such filter comprising:
      a filter on-chip component;
      wherein the low pass filter section has a cut-off frequency related to the filter on-chip component;
   a control circuit, comprising:
      an on-chip component;
      an off-chip component;
      the control circuit on-chip component and the filter on-chip component being matched;
      wherein the control circuit off-chip component is established in accordance with a desired low pass filter section cut-off frequency;
      wherein the control circuit on-chip component is automatically adjusted by a control signal produced by the control circuit and;
      wherein the control signal is then used to adjust the filter on-chip component thereby automatically providing the desired cut-off frequency for the low pass filter section.

2. A filter, comprising:
   a semiconductor integrated circuit chip;

a low pass filter section on the chip, such filter comprising:
  a filter transconductor; and
  a filter capacitor connected to the filter transconductor, the low pass filter section having a cut-off frequency related to the transconductance, $gm_F$, of the filter transconductor and the capacitance of the filter capacitor;
a gm control circuit, comprising:
  a control circuit transconductor;
  an off-chip resistor $R_{EXT}$;
  an off-chip capacitor $C_{EXT}$;
wherein the product $R_{EXT}C_{EXT}$ is established in accordance with a desired low pass filter section cut-off frequency;
  on-chip capacitor, $C_{INT}$, matched to the filter capacitor; and
  wherein the $gm_F$ of the filter transconductor is varied to maintain $R_{EXT}C_{EXT}$ proportional to $gm_F^{-1}$-$1C_{INT}$ automatically adjusted by a control signal produced by the control circuit so that its $gm_C^{-1}$ times $C_{INT}$ product is in proper proportional to $R_{EXT}C_{EXT}$, and
wherein the control signal is then used to adjust the $gm_F$ of the filter transconductor thereby automatically providing the proper cut-off frequency for the low pass filter section.

3. A filter, comprising:
(a) a semiconductor chip;
(b) a low pass filter section on the chip, such low pass filter section having a predetermined cut-off frequency, such cut-off frequency being a function of an on-chip component of the filter, such on-chip component being adapted to vary in accordance with a control signal;
(c) a control circuit, comprising:
  (i) a control circuit on-chip component;
  (ii) a control circuit off-chip component;
  (ii) a first oscillator for producing a reference frequency, such first oscillator having the control circuit off-chip component, the reference frequency being a function of the control circuit off-chip component, such reference frequency being selected in accordance with the predetermined cut-off frequency of the filter;
  (iii) a second oscillator on the chip for producing a variable frequency, such variable frequency being a function of the control circuit on-chip component, such variable frequency being controlled by the control signal;
  (iv) a control loop, responsive to a difference between the reference frequency and the variable frequency for producing a feedback signal to drive the variable frequency towards the reference frequency and to correspondingly vary the filter on-chip component and thereby the cut-off frequency of the filter.

4. A filter, comprising:
(a) a semiconductor chip;
(b) a low pass filter section on the chip, such low pass filter section, comprising:
  (i) a filter transconductor;
  (ii) a filter capacitor connected to the filter transconductor, such low pass filter section having a cut-off frequency related to the transconductance, $gm_F$, of the filter transconductor and the capacitance of the filter capacitor;
(c) a gm control circuit having a control circuit transconductor, such gm control circuit comprising:
  (i) a first oscillator for producing a reference frequency, such first oscillator having: a portion thereof on the chip; and, an off-chip capacitor, the reference frequency being a function of the capacitance of the off-chip capacitor;
  (ii) a second oscillator on the chip for producing a variable frequency, such second oscillator having an on-chip capacitor, such variable frequency being a function of the capacitance of the on-chip capacitor, such variable frequency being controlled by a control circuit transconductor control signal;
  (iii) a control loop, responsive to a difference between the reference frequency and the variable frequency for producing a feedback signal to drive the variable frequency towards the reference frequency; and
  (iv) wherein the control loop transconductor is fed by the control circuit transconductor control signal, such control circuit transconductor control signal varying the transconductance of the control circuit transconductor in accordance with the control circuit transconductor control signal and correspondingly changes the transconductance of the filter transconductor, and hence the cut-off frequency of the low pass filter section.

5. The filter recited in claim 4 including a plurality of serially coupled ones of the low pass filter section, the transconductance of the filter transconductor thereof being varied in accordance with the control circuit transconductor control signal produced by the gm control circuit.

6. The filter recited in claim 4 wherein the gm control circuit comprises:
a frequency comparator, fed by the reference frequency and the variable frequency, for producing an output signal related to the difference between such fed signals;
a variable current source controlled by the output signal, an output of the current source providing the control circuit transconductor control signal for the control circuit transconductor;
a common mode reference voltage fed to the control circuit transconductor;
a common mode voltage control circuit fed by the common mode reference voltage and an output of the control circuit transconductor for providing a common mode control signal related to the common mode reference voltage;
a second current source controlled by the common mode control signal for supplying current to the control circuit transconductor in accordance with the common mode control signal;
a control voltage feedback loop, responsive to the current supplied by the second current source to the control circuit transconductor for producing the feedback signal.

7. The filter recited in claim 6 including a plurality of serially coupled ones of the low pass filter section, the transconductance of the filter transconductor thereof being varied in accordance with the control circuit transconductor control signal produced by the gm control circuit.

\* \* \* \* \*